United States Patent [19]
Ota

[11] Patent Number: 5,459,003
[45] Date of Patent: Oct. 17, 1995

[54] EXPOSURE METHOD FOR FORMING SLOPING SIDEWALLS IN PHOTORESISTS

[75] Inventor: Kazuya Ota, Tokyo, Japan

[73] Assignee: Nikon Corporation, Tokyo, Japan

[21] Appl. No.: 350,014

[22] Filed: Dec. 6, 1994

Related U.S. Application Data

[63] Continuation of Ser. No. 204,969, Mar. 2, 1994, abandoned.

[30] Foreign Application Priority Data

Mar. 3, 1993 [JP] Japan ................................. 5-042425

[51] Int. Cl.⁶ ........................................................ G03F 9/00
[52] U.S. Cl. ................... 430/22; 430/5; 430/322; 430/323; 430/326; 430/394; 430/396; 430/397
[58] Field of Search ................................. 430/322, 394, 430/323, 326, 396, 397, 22, 5

[56] References Cited

U.S. PATENT DOCUMENTS 4,935,334  6/1990  Boettiger et al. ........................... 430/5

Primary Examiner—S. Rosasco
Attorney, Agent, or Firm—Shapiro and Shapiro

[57] ABSTRACT

A method of forming side surfaces of photosensitive material removed areas is performed so that the side surfaces are inclined to the surface of a substrate when transferring a pattern formed on a mask onto the substrate coated with a photosensitive material and effecting a developing process on the substrate. An image of the pattern to be transferred onto the substrate and the substrate are relatively shifted in a direction along the surface of the substrate during the transfer.

8 Claims, 6 Drawing Sheets

FIG. 5A
FIG. 5C
FIG. 5B
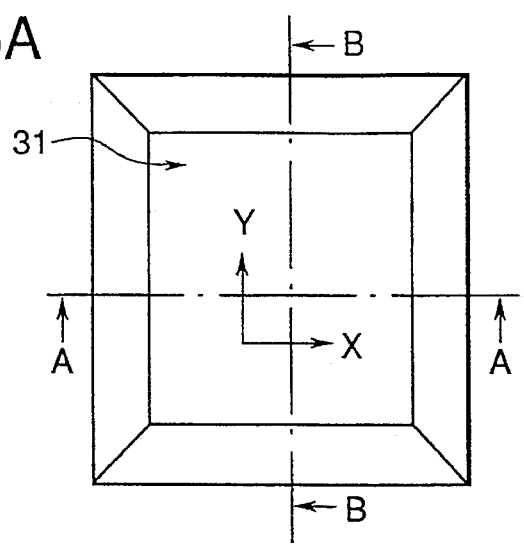
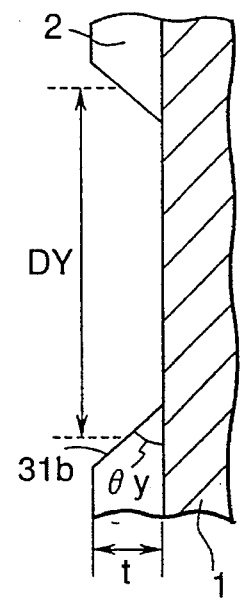
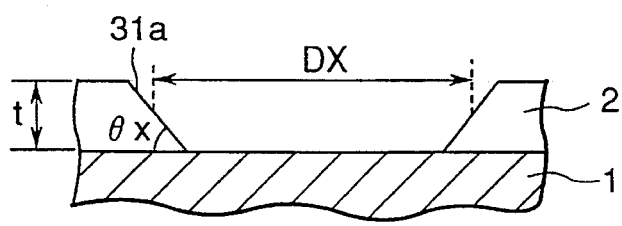
FIG. 6
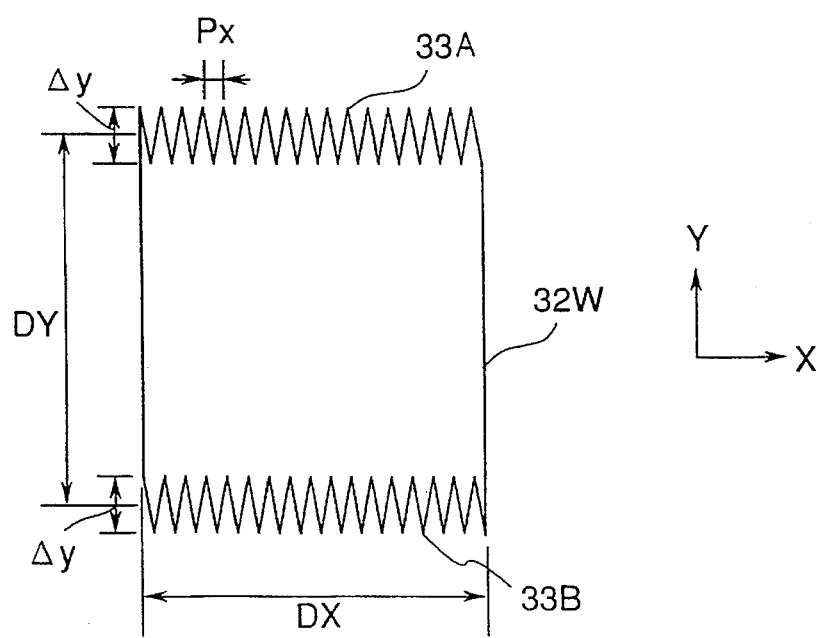

EXPOSURE METHOD FOR FORMING SLOPING SIDEWALLS IN PHOTORESISTS

This is a continuation application Ser. No. 08/204,969, filed Mar. 2, 1994, now abandoned.

BACKGROUND OF THE INVENTION

1. Field of the Invention

The present invention relates to an exposure method suitable for an application to an exposure apparatus for transferring patterns on a reticle onto a photosensitive substrate when manufacturing, e.g., a thin-film magnetic head or a semiconductor device, etc. by a photolithography process.

2. Related Background Art

Manufacturing, e.g., a thin-film magnetic head or a semiconductor device by a photolithography process has hitherto involved the use of a projection exposure apparatus. The projection exposure apparatus projects patterns on a photomask or a reticle (hereinafter generically termed a [reticle]) onto a substrate (a semiconductor wafer, a ceramics plate, a glass plate, etc.) coated with a photosensitive material such as a photoresist or the like through a projection optical system. For instance, an area corresponding to a predetermined pattern on a predetermined substrate is required to be cut off. In this case, an image of the predetermined pattern is projected on the substrate coated with the photoresist through the projection exposure apparatus. Thereafter, the photoresist on the area corresponding to the image of the predetermined pattern is removed by a developing process. Thus, only a substrate surface of the photoresist-removed area can be cut by an etching equipment.

Recently, a dry etching equipment has been employed as the etching equipment. The dry etching equipment physically cuts the surface by partially colliding the photo-resist-removed substrate with atoms like argon (Ar), etc. When the substrate surface is etched on the order of several μm to several tens μm by use of the etching equipment described above, it is required that the photoresist be also on the order of several tens μm thick. It is because a selection ratio of the photoresist serving as a protection film to the substance on the substrate surface is smaller than in the case of performing etching with the aid of a reactive gas.

FIG. 8 illustrates a profile of the substrate when etched in such a manner. Referring to FIG. 8, the surface of the substrate 1 is covered with a photoresist 2. The photoresist corresponding to a pattern 3 to be etched is removed. Further, side surfaces (hereinafter simply called [edges]) 3a of the photoresist 2 corresponding to edges of the pattern 3 are substantially perpendicular to the surface of the substrate 1. For example, argon atoms 4 fall on the substrate 1 from above of the pattern 3, with the result that a substance of the substrate 1 at the bottom of the pattern 3 is cut off. A recess 5 is thus formed. As illustrated in FIG. 8, however, if the edges 3a of the photoresist are steeply inclined, fragments of the cut-off substance 6 of the surface of the substrate 1 are adhered to the edges 3a of the photoresist. The adhered substance may turn out to be an obstacle against the etching effected afterward in some cases. Making the inclinations of the edges 3a gentle is effective in preventing the adhesion of the substance of the surface of the substrate 1.

FIG. 9 shows an example where the edges have gentle inclinations. Referring to FIG. 9, edges 7a of a pattern 7 in the photoresist covered on the substrate 1 are inclined to the substrate 1. For this reason, even when the argon atoms 4 collide with the substrate via the pattern 7, the fragments of the surface substance of the substrate 1 are not adhered to the edges 7a and do not.

A method of forming the edges 7a having the gentle inclinations as shown in FIG. 9 in the photoresist 2 may be a so-called defocus method. The defocus method is a known method of exposing a reticle pattern by hitherto shifting the substrate 1 from a focal position of a projection optical system of a projection exposure apparatus. A developing process is effected on the photoresist 2 on the substrate 1 undergoing an exposure based on the defocus method described above. The photoresist is thereby removed in a profile as illustrated in FIG. 9. Further, setting a defocus quantity to a predetermined magnitude has hitherto involved the use of an autofocus sensor for detecting a quantity of positional deviation of an exposure plane of the substrate 1 from a best image forming plane of the projection optical system.

If a width of the pattern projected on the substrate is larger than a resolving power of the projection optical system according to the defocus method, however, a remarkably large defocus quantity (e.g., 100 μm or above) is needed. There exists a possibility of exceeding a follow-up range of the autofocus sensor. This is conducive to the following drawback. When transferring a pattern having a large width onto the substrate, it is difficult to make gentle the inclinations of the edges of the photoresist-removed areas after the developing process.

SUMMARY OF THE INVENTION

It is a primary object of the present invention, which has been devised under such circumstances, to provide an exposure method capable of making gentle inclinations of even edges of a pattern having a large width in a photosensitive material after developing the photosensitive material on a substrate.

To accomplish the above object, according to one aspect of the present invention, there is provided a method of forming side surfaces of removed areas of a photosensitive material (2) so that the side surfaces are inclined to the surface of a substrate (1) when transferring a pattern formed on a mask (9) onto the substrate (1) coated with the photosensitive material (2) and affecting a developing process on the substrate (1). This method comprises a step of relatively shifting an image of the pattern to be transferred onto the substrate (1) and the substrate (1) in a direction along the surface of the substrate (1) during the transfer.

According to another aspect of the present invention, there is provided a method of transferring a pattern formed in a mask (9) onto a substrate (1) coated with a photosensitive material (2) under exposure light. This method comprises a step of relatively shifting an image of the pattern transferred onto the substrate (1) and the substrate (1) in a direction along the surface of the substrate (1) till an exposure quantity of the exposure light on the photosensitive material (2) reaches a proper exposure quantity.

According to the present invention described above, the image of the pattern transferred onto the substrate (1) and the substrate (1) are relatively shifted during a transfer of the pattern of the mask (9). Hence, a light quantity distribution of exposure light (Ill.) on the photosensitive material (2) on the substrate (1) takes, if the photosensitive material (2) is of a positive type, a crest-like shape as shown by a distribution curve (25), as shown in FIG. 2D but takes, if the photosensitive material (2) is of a negative type, a trough-like shape as shown by a distribution curve (26). Therefore, the side surface of the removed area of the photosensitive material (2) after effecting the developing process on the photosensitive material (2) are inclined to the substrate. Further, even when the pattern has a large width, it is possible to make gentle the inclinations of the photosensitive material which correspond to the pattern edges with a larger quantity of relative movement between the pattern image and the substrate (1).

According to still another aspect of the present invention, there is provided a method of transferring a pattern formed on a mask (9) onto a substrate (1) coated with a photosensitive material under exposure light. The method comprises a step of previously forming pattern edges parallel to a predetermined direction in a sawtooth shape; and a step of relatively shifting an image of the pattern transferred onto the substrate (1) and the substrate (1) in a direction along the surface of the substrate (1) till an exposure quantity of the exposure light on the photosensitive material (2) reaches a proper exposure quantity.

According to the above-mentioned second exposure method, as illustrated in, e.g., FIG. 6, the edges (33A, 33B) of the pattern to be transferred are previously formed in the sawtooth shape. Hence, the mask (9) and the substrate (1) are relatively moved by one or more pitches (Px) of the sawtooth edges in a direction parallel to an envelope (33Ba) of the sawtooth edges. Hereat, an exposure quantity distribution of the exposed area of the photosensitive material (2) through the sawtooth edges (33A, 33B) assumes an inclined configuration. Further, the exposure quantity distribution takes the inclined configuration by dint of the same action as that by the first exposure method explained above at portions intersecting the sawtooth edges (33A, 33B). Accordingly, as depicted in, e.g., FIGS. 5A–5C, the edges can be two-dimensionally inclined by developing the photosensitive material (2).

BRIEF DESCRIPTION OF THE DRAWINGS

Other objects and advantages of the present invention will become apparent during the following discussion in conjunction with the accompanying drawings, in which:

FIG. 5A is a plan view illustrating a state of inclination of the photoresist at which a second embodiment of the present invention aims; FIG. 5B is a sectional end view taken substantially along the line A—A of FIG. 5A; FIG. 5C is a sectional end view taken substantially along the line B—B of FIG. 5A;

FIG. 6 is a plan view illustrating a projected image of a reticle pattern, used in the second embodiment, on the substrate;

DESCRIPTION OF THE PREFERRED EMBODIMENTS

A first embodiment of the present invention will hereinafter be described with reference to FIGS. 1–4.

Figure 1:
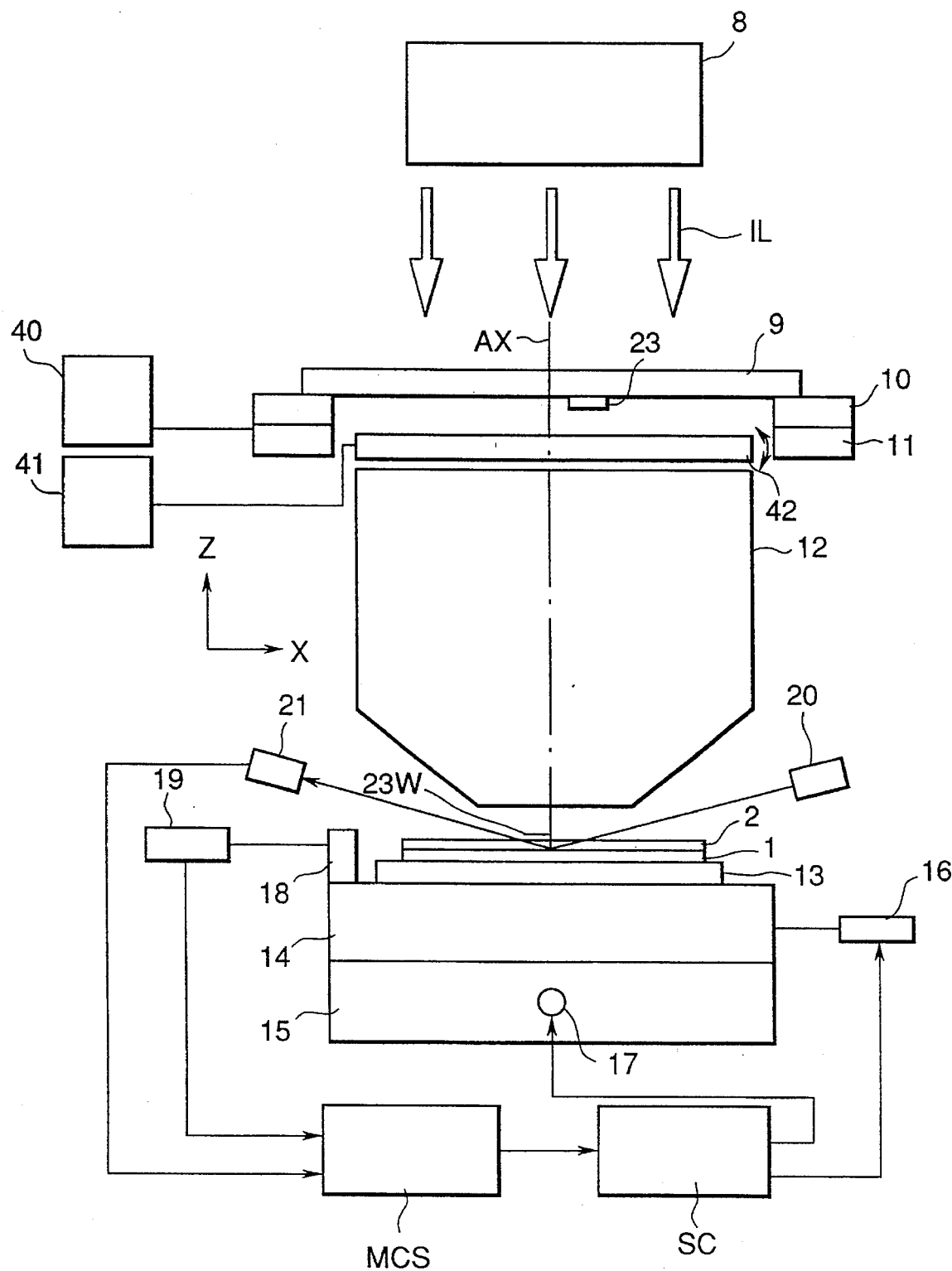
FIG. 1 is a block diagram schematically illustrating a reduction projection type exposure apparatus to which an exposure method in an embodiment of this invention is applied.

FIG. 1 illustrates a reduction projection type exposure apparatus to which an exposure method in this embodiment is applied. Referring to FIG. 1, an illumination optical system 8 irradiates a reticle 9 with beams of exposure light IL at a uniform illuminance during an exposure process. The illumination optical system 8 incorporates a shutter mechanism for intercepting or transmitting the exposure light from the light source at a desired timing.

The reticle 9 is placed on an X-stage 10 on the reticle side. This reticle-side X-stage 10 is disposed on a reticle-side Y-stage. 11. The reticle-side X-stage 10 moves the reticle 9 in an X-direction within a plane perpendicular to an optical axis AX of a projection optical system 12 which will be mentioned later. The reticle-side Y-stage 11 moves reticle 9 in a Y-direction perpendicular to the X-direction within the plane perpendicular to the optical axis AX thereof. Further, the reticle-side X- and Y-stages 10, 11 are driven by a driving unit 40. Then, images of transfer patterns formed on the reticle 1 are reduced by the projection optical system 12 at a predetermined projection magnification. The images are projected on a substrate 1 coated with a photoresist 2. The substrate 1 involves the use of a ceramics substrate or a semiconductor wafer.

Further, a plane-parallel glass 42 is disposed between the mask 9 and the projection optical system 12. This plane-parallel glass 42 has a rotary shaft intersecting the optical axis AX of the projection optical system 12, wherein a longitudinal direction is the direction perpendicular to the sheet surface in FIG. 1. The plane-parallel glass 42 is rotatable about this rotary shaft in a range of a predetermined angle. The plane-parallel glass 42 is also driven by a driving unit 41. This plane-parallel Glass 42 is capable of moving an image of a pattern 23 of the mask 9 which is to be projected on the substrate 1 in the (X-) direction along the surface of the substrate 1.

The substrate 1 is held on a Z-stage 13 for positioning the substrate 1 in a Z-direction parallel to the optical axis of the projection optical system 12. This Z-stage 13 is placed on a wafer-side X-stage 14 for moving the substrate 1 in the X-direction. The wafer-side X-stage 14 is placed on a wafer-side Y-stage 15 for moving the substrate 1 in the Y-direction. The wafer-side X- and Y-stages 14, 15 are driven by driving units 16, 17, respectively. A stage drive controller SC outputs control signals to the respective driving units 16, 17 on the basis of a command signal from a main control system MCS. The stage drive controller SC thus controls movements of the wafer-side X- and Y-stages 14, 15.

Further, a movable mirror 18 having a reflecting surface perpendicular to the X-direction is mounted on the wafer-side stage 14. A wafer-side interferometer 19 irradiates the reflecting surface of the movable mirror 18 with laser beams. The interferometer 19 monitors an X-coordinate position of the wafer-side X-stage 14 with a high accuracy all the time by receiving beams of reflected light. Similarly, a movable mirror (unillustrated) having a reflecting surface perpendicular to the Y-direction is mounted on the wafer-side X-stage 14. Then, an interferometer, which has the same configuration as that of the wafer-side interferometer 19 described above, monitors a Y-coordinate position of the wafer-side X-stage 14. Outputted to the main control system MCS are detection signals of these X- and Y-coordinate positions of the wafer-side X-stage 14. Based on these signals, the main control system MCS governs and controls the whole apparatus as well as regulating the coordinate-positions of the substrate 1.

Further, a focus position detecting system for an autofocus mechanism is disposed upwardly of the substrate 1. The focus position detecting system is constructed of a light sending system 20 and a light receiving system 21. For instance, a slit pattern image is so projected on an exposure plane of the substrate 1 as to be inclined to the optical axis AX of the projection optical system 12. Then, the light receiving system 21 receives the beams reflected from the substrate 1. The slit pattern image on the substrate 1 is reformed inwardly of the light receiving system 21. The light receiving system 21 outputs a focus signal corresponding to a position of the reformed image to the main control system MCS. When the substrate 1 moves in the Z-direction, the position of the slit pattern image reformed inwardly of the light receiving system 21 shifts sideway. A Z-directional position (focus position) of the substrate 1 can be detected based on the focus signal. The exposure plane of the substrate 1 in this embodiment is set in the same focus position as that in the case of exposing ordinary reticle patterns.

Figure 2A:
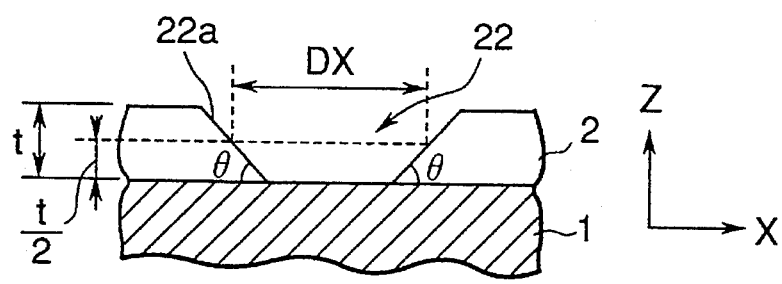
FIG. 2A is an end view taken along a section, showing inclinations of a photoresist at which a first embodiment aims.

Turning next to FIGS. 2A, 2B, 2C and 2D the exposure method in this embodiment will be discussed. This embodiment aims at removing, as illustrated in FIG. 2A, an area corresponding to a pattern 22 in a photoresist 22 having a thickness t enough to cover the substrate 1 through the developing process after the exposure. This embodiment also aims at making an edge 22a of the pattern 22 inclined at an angle θ (0°<θ<90°) to the surface of the substrate 1 in the X-direction. Further, referring to FIG. 2A, DX is the X-directional width of the pattern 22 in a position corresponding to a thickness t/2 of the photoresist 2. Giving one example, the thickness t of the photoresist 2 is on the order of 5 μm–50 μm, the angle θ is approximately 60°, and the pattern width DX is approximately 50 μm.

Figure 2B:
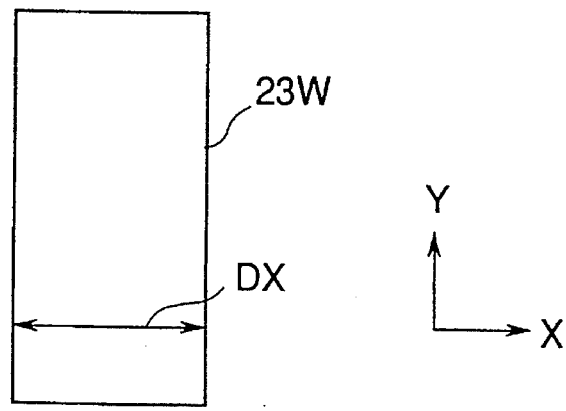
FIG. 2B is a view illustrating a projected image of an on-the-reticle pattern, employed in the first embodiment, onto a substrate.

FIG. 2B illustrates an image 23W, projected on the substrate 1, of the pattern formed on the reticle 9 in this embodiment. As shown in FIG. 2B, the X-directional width of the projected image 23W is set to DX (the same as the width DX in FIG. 2A). A pattern 23 conjugate to this projected image 23W and the projection optical system 12 is formed in a pattern area of the reticle 1 of FIG. 1. Further, when the photoresist 2 is a positive type, an interior of the projected image 23W thereof is a bright portion (irradiated with the exposure light IL). When the photoresist 2 is a negative type, the interior of the projected image 23W thereof is a dark portion (masked from the exposure light IL).

Figure 2C:
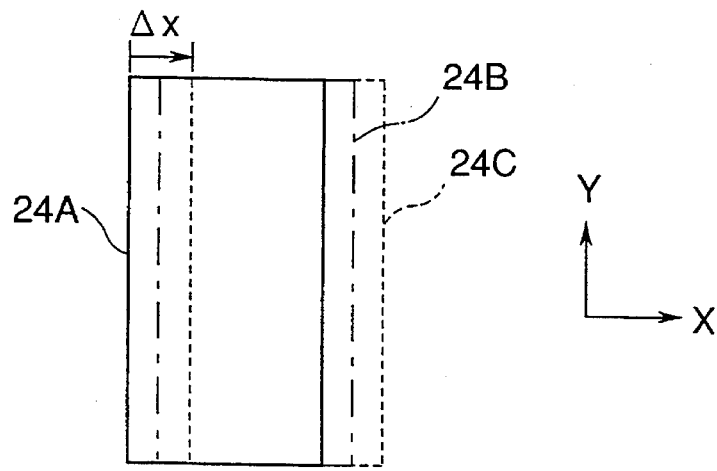
FIG. 2C is a view showing how the projected image of FIG. 2B continuously moves on the substrate.

To start with, the main control system MCS regulates a Z-directional position of the Z-stage 13 on the basis of the focus signals from the focus position detecting systems 20, 21. The main control system MCS thus makes the exposure plane of the substrate 1 coincident with an image forming plane of the projection optical system 12. Then, the illumination optical system 8 starts irradiating the reticle 9 of FIG. 1 with the exposure light IL. Simultaneously, an X-directional movement of the substrate 1 is started. Just when the substrate 1 moves by Δx in the X-direction, the irradiation of the exposure light IL is stopped. More specifically, as illustrated in FIG. 2C, the projected image 23W of FIG. 2B shifts continuously from a position 24A via a position 24B to a shift 24C on the substrate 1 and on the photoresist 2. The position 24A is spaced by Δx in the X-direction away from the position 24C. Using the thickness t and the angle θ of FIG. 2A, the spacing (moving quantity of the substrate 1) Δx is set as follows:

$$\Delta x = t/\tan \theta \quad (1)$$

Figure 2D:
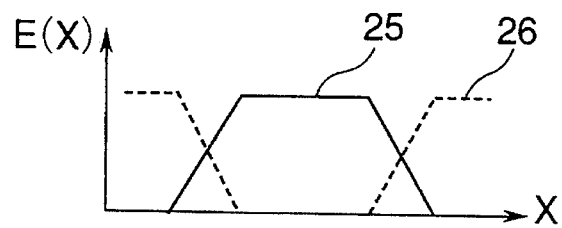
FIG. 2D is a diagram illustrating exposure quantity distributions on the photoresist on the substrate.

FIG. 2D shows an X-directional exposure quantity distribution E(X) on the photoresist 2 on the substrate 1. According to this embodiment, in the case of the photoresist 2 being of the positive type, a central portion of the pattern is always irradiated with the exposure light. A peripheral portion is short in terms of an irradiation time of the exposure light, and therefore, the exposure quantity distribution is formed, as depicted by a distribution curve 25, in a crest-like shape in the X-direction. Accordingly, when developing the photoresist, a central portion of the pattern is completely removed off, and the residual resist film left thereon becomes thicker as it approaches its peripheral portion. Consequently, as illustrated in FIG. 2A, the inclined angle θ of the edge 22a becomes gentle. On the other hand, in the case of the photoresist 2 being of the negative type, the exposure quantity distribution is formed, as shown by a distribution curve 26 of FIG. 2D, in a trough-like shape in the X-direction. Hence, the photoresist 2 is left in the crest-like shape by developing this portion, with the result that the edge thereof is inclined gently at an angle θ.

Note that the start/stop timings of the movement of the substrate 1 are not necessarily coincident with those of the irradiation of the exposure light during the exposure as in the above example. For instance, the substrate 1 is moved beforehand through the wafer-side stages 14, 15. Just when the substrate 1 approaches a first predetermined position, the control may be done to start the irradiation of the exposure light IL. Just when approaching a second predetermined position, the control may be performed to stop the irradiation of the exposure light IL. At this time, it is desirable that the substrate 1 shifts from the first position to the second position, keeping a fixed velocity. Further, the substrate 1 must not be continuously moved but may be intermittently moved by microdistances (hereinafter called [stepping]). At this time, the irradiation of the exposure light IL may be continuously effected. Alternatively, the shutter mechanism incorporated into the illumination optical system 6 may be controlled to repeat on/off actions in synchronism with the stepping actions of the substrate 1.

Figure 3A:
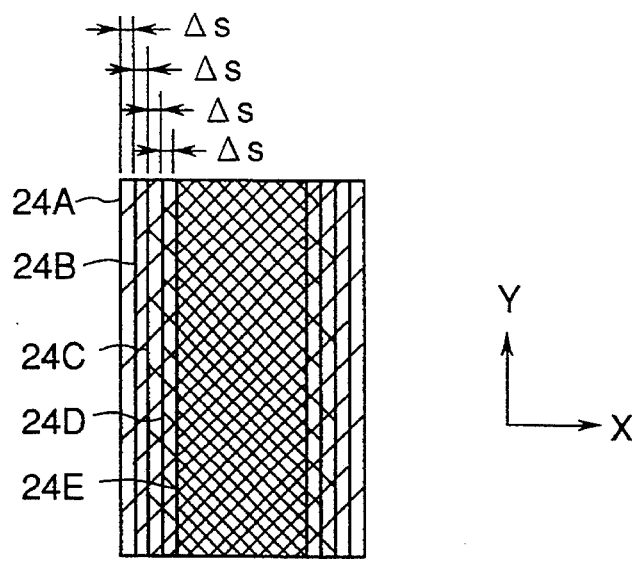
FIG. 3A is a view showing how the projected image moves on the substrate by a stepping method in the first embodiment.
Figure 3B:
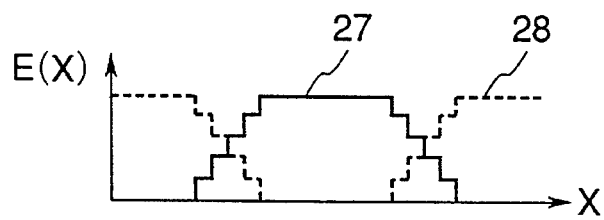
FIG. 3B is a diagram showing exposure quantity distributions on the photoresist on the substrate.

FIGS. 3A and 3B show an example of how the irradiation of the exposure light IL is synchronized with the stepping actions of the substrate 1. When the projected image 23W shown in FIG. 2B exists in the position 24A on the substrate 1 of FIG. 3A, the irradiation of the exposure light takes place. Next, the irradiation of the exposure light also takes place when the projected image 23W reaches the position 24B by stepping the substrate 1 by Δs in the X-direction.

Thereafter, the irradiation of the exposure light IL is effected each time the projected image 23W reaches the positions 24C, 24D, 24E by sequentially stepping the substrate 1 by Δs. A stepping quantity As is given by Δx/n, where n (an integer of 2 or larger) is the number of stepping actions. The X-directional exposure quantity distribution E(X) on the photoresist 2 on the substrate 1 takes a stepwise form as shown by a distribution curve 27 or 28 of FIG. 3B. If the photoresist 2 is of the positive type, the crest-like distribution curve 27 is given. Whereas if of the negative type, the trough-like distribution curve 28 is given. In this case also, the pattern edge is approximately gently inclined as shown in FIG. 2A by developing the photoresist 2.

Figure 4:
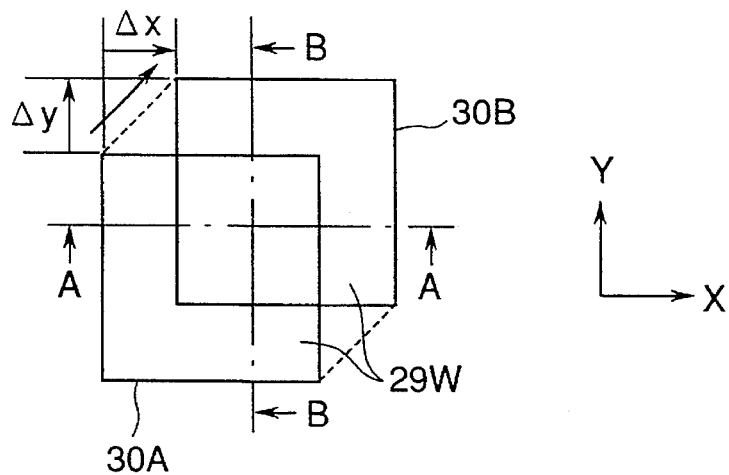
FIG. 4 is a view illustrating a trajectory of the projected image of the pattern on the substrate when moving the substrate in a direction intersecting edges of the pattern to be transferred in the first embodiment.

Note that the substrate 1 is moved in the X-direction perpendicular to the pattern edge in the embodiment discussed above. The substrate 1 is not, however, necessarily moved in the direction perpendicular to the pattern edge. FIG. 4 gives an illustration of a trajectory of the projected image on the substrate 1 when moving the substrate 1 in such a direction as to intersect the pattern edge in that manner. Referring to FIG. 4, a rectangular projected image 29W is an image formed by projecting an on-the-reticle pattern on the substrate 1 through the projection optical system. In this example, the substrate 1 is moved in such directions as to be inclined at 45° respectively to the X- and Y-directions. The projected image 29W is thereby shifted from a position 30A to a position 30B on the substrate 1. The substrate 1 may be continuously moved or stepped. Further, the positions 30A, 30B are spaced by Δx and Δy in the X- and Y-directions from each other.

With this arrangement, the exposure quantity distribution on the photoresist 2 in profile along the line A—A parallel to the X-direction of FIG. 4 has an inclination as shown in FIG. 2D. The exposure quantity distribution on the photoresist 2 in profile along the line B—B parallel to the Y-direction of FIG. 4 likewise has the inclination as shown in FIG. 2D. Accordingly, when developing the photoresist after the exposure, the edges in the X- and Y-directions are respectively gently inclined.

Next, a second embodiment of this invention will be explained with reference to FIGS. 5A, 5B, 5C, 6 and 7. The exposure method in this embodiment is also embodied by the reduction projection type exposure apparatus of FIG. 1. This embodiment aims at the following. With the development of the photoresist 2 after being exposed, as illustrated in FIG. 5B, an X-directional edge 31a of a pattern 31 is inclined at an angle $\theta_x$ (0°<$\theta_x$<90°) to the substrate 1. Simultaneously, as shown in FIG. 5C, a Y-directional edge 31b of the pattern 31 is inclined at an angle $\theta_y$ (0°<$\theta_y$<90°) to the substrate 1. Further, let DX, DY be X- and Y-directional widths of the pattern 31 in a position where the thickness of the photoresist is t/2.

FIG. 6 illustrates a projected image 32W formed by projecting an on-the-reticle pattern in this embodiment on the substrate 1 via the projection optical system. Referring to FIG. 6, the edges of the on-the-reticle pattern at both ends in the Y-direction are formed in a sawtooth shape. Hence, edges 33A, 33B of the projected image 32W at both ends in the Y-direction each assume the sawtooth shape having a pitch $P_x$ in the X-direction. Then, let Δy be a Y-directional amplitude of each of these sawtooth edges 33A, 33B. Let DY (identical with the width DY in FIG. 5C) be a Y-directional interval between the center (central position of the Y-directional amplitude) of the edge 33A and the center (central position of the Y-directional amplitude) of the edge 33B. Using the angle $\theta_y$ and the thickness t of the photoresist 2 in FIG. 5C, the amplitude Δy can be expressed by the following formula:

$$\Delta y = t/\tan \theta_y \quad (2)$$

Further, edges of the projected image 32W at both ends in the X-direction each assume a linearity. Let DX (identical with the width DX in FIG. 5B) be an X-directional interval between the X-directional edges at both ends thereof. Additionally, as in the first embodiment, if the photoresist 2 is of the positive type, an interior of the projected image 32W is a bright portion. Whereas if of the negative type, the interior of the projected image 32W is a dark portion.

Figure 7:
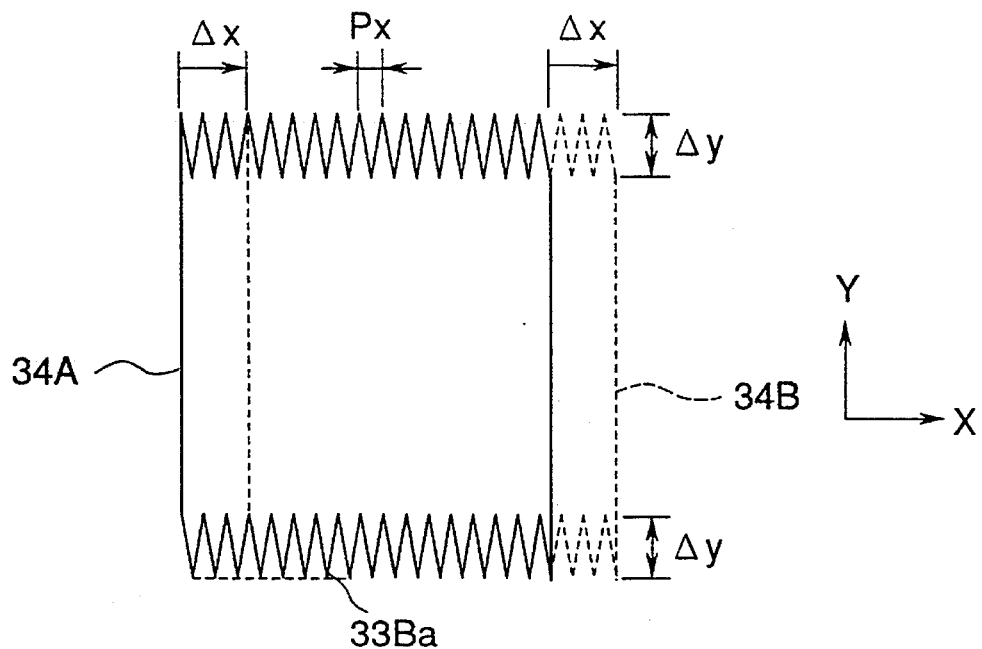
FIG. 7 is a view showing a state of how the projected image of FIG. 6 moves on the substrate in the second embodiment.
Figure 8:
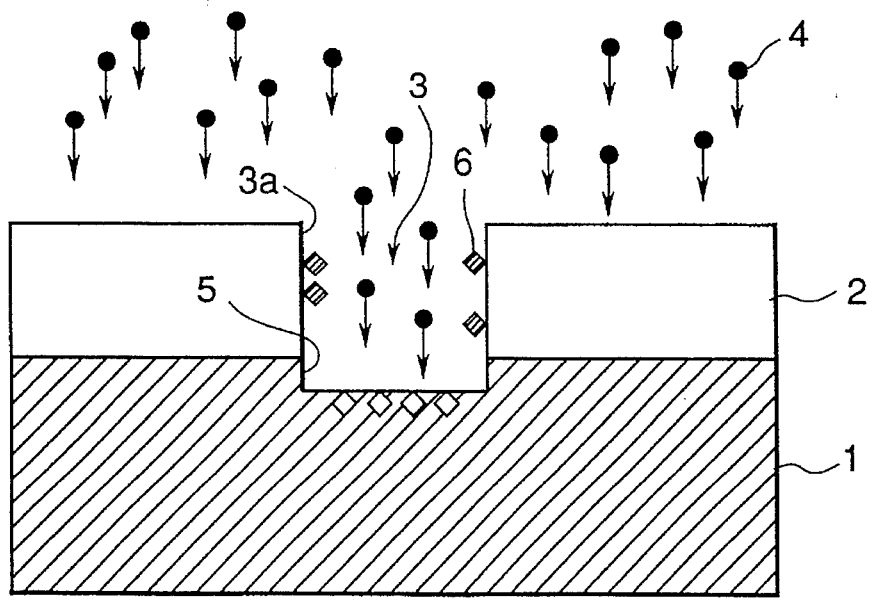
FIG. 8 is a view showing how etching is effected when inclinations of edges of the photoresist are substantially perpendicular to the substrate.
Figure 9:
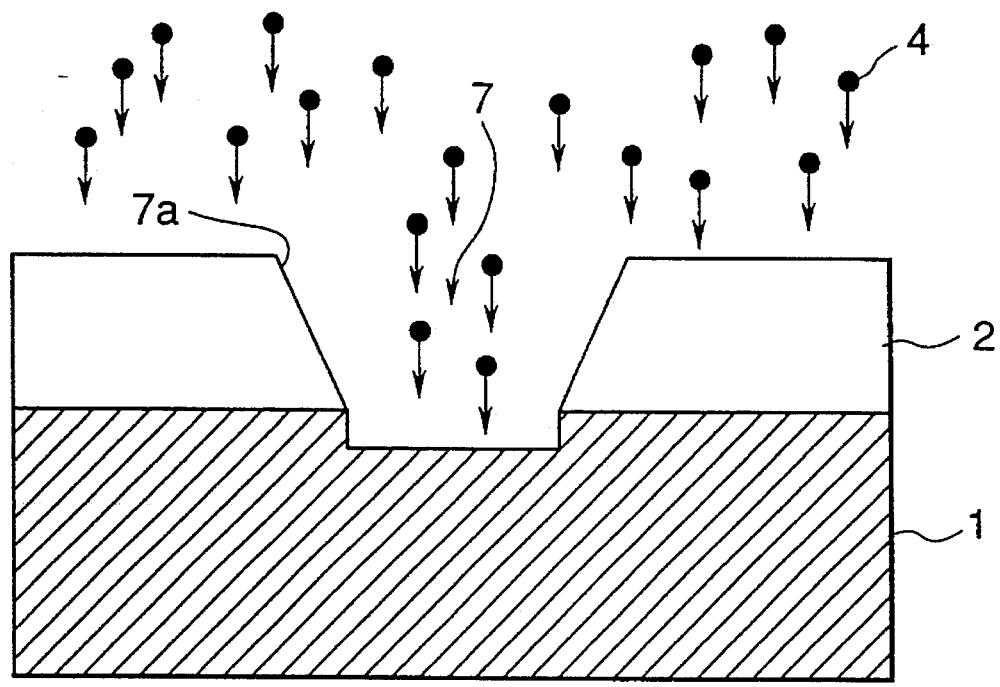
FIG. 9 is a view showing how the etching is performed when the edges of the photoresist have gentle inclinations.

Then, as in the same way with the first preceding embodiment, the main control system MCS makes the exposure plane of the substrate 1 coincident with the image forming plane of the projection optical system 12. Then, simultaneously when the illumination optical system 8 starts irradiating the reticle 9 of FIG. 1 with the exposure light IL, the X-directional movement of the substrate 1 is started. Just when the substrate 1 moves by Δx in the X-direction, there are stopped both of the movement of the substrate 1 and the irradiation of the exposure light IL. More specifically, as illustrated in FIG. 7, the projected image 32W shifts from a position 34A to a position 34B on the substrate 1. The positions 34A, 34B are spaced away from each other by Δx in the X-direction parallel to an envelope line 33Ba of the Y-directional edge of the projected image 32W. Using the thickness t and the angle $\theta_x$ in FIG. 5B, a spacing (moving quantity of the substrate 1) Δx is set as follows:

$$\Delta x = t/\tan \theta_x \quad (3)$$

Further, for substantially flattening an inclined surface of the edge 31b of FIG. 5C, it is required that the moving quantity Δx be equal to or larger than the X-directional pitch $P_x$ of each of the sawtooth edges 33A, 33B. The X-directional pitch $P_x$ in this embodiment is set by a factor of an integer of the X-directional moving quantity Δx. That is, the pitch $P_x$ can be expressed by using an integer of 1 or greater as follows:

$$P_x = \Delta x/m \quad (4)$$

In accordance with this embodiment, when the photoresist 2 is of the positive type, in the areas of the photoresist 2 exposed at the sawtooth edges 33A, 33B of the projected image 32W at both ends in the Y-directional in FIG. 6, the exposure quantity becomes smaller with more approach to the peripheral portion of the sawtooth edge. Further, the exposure quantity also becomes smaller with more approach to the peripheral portion of the edge in the areas of the photoresist 2, wherein the two X-directional edges of the projected image 32W of FIG. 6 shift. Accordingly, the X- and Y-directional edges of the photoresist 2 are thereby, as illustrated in FIG. 5, inclined respectively at the angles $\theta_x$, $\theta_y$ by developing the photoresist 2 exposed as shown in FIG. 7. Note that the amplitude Δy of each of the sawtooth edges 33A, 33B of FIG. 6 is equalized to the X-directional moving quantity Δx of the substrate 1. The X- and Y-directional inclined angles of the edges of the photoresist 2 are thereby equalized to each other.

In addition, when the photoresist 2 is of the negative type, as in the case of the positive type, the similarly inclined edges are obtained with only an inversion of the exposure quantity distribution.

Further, in the second embodiment discussed above, the edges of the reticle pattern at both ends in the Y-direction are formed in the sawtooth shape. The configuration is not, however, limited particularly to the sawtooth shape. The edges may be configured in, e.g., a waveform (sinusoidal waveform).

Moreover, the pattern image of the reticle 9 is exposed with the movement of the substrate 1 in the first and second embodiments discussed above. However, the exposure may be performed with the movement of the reticle 9 in a state where the substrate 1 is fixed. For instance, in the first preceding embodiment, the projected image 23W of FIG. 2B may be exposed on the photoresist 2 on the substrate 1 while the reticle 9 is moved by $\Delta x/\beta$ in the X-direction in the fixed state of the substrate 1, where $\beta$ is the projection magnification of the projection optical system 12 from the reticle 9 onto the substrate 1.

Further, for example, the angle to the optical axis AX of the plane-parallel glass 42 shown in FIG. 1 may be changed during the pattern exposure. With this change, the position of the projected image 23W on the substrate 1 can be shifted without moving the mask 9 and the substrate 1. It is thus possible to obtain the crest-like (or trough-like) exposure distribution shown in FIG. 2D.

Note that the present invention is not, as a matter of course, restricted to the embodiments discussed above but may take a variety of constructions without deviating from the gist of the invention.

What is claimed is:

1. A method of forming a photoresist pattern having an opening with a sloping wall, comprising:

a step of exposing a photoresist coated on a substrate through a pattern image of a mask;

wherein the pattern image has an edge which changes periodically in a predetermined direction, and at least one of said pattern image and said substrate is moved during exposure in such a manner that said pattern image and said substrate shift relatively in the predetermined direction.

2. A method according to claim 1, wherein at least one of said pattern image and said substrate is movable in such a manner that said pattern image and said substrate shift more than a pitch of said edge.

3. A method according to claim 1, wherein at least one of said pattern image and said substrate is movable in such a manner that said pattern image and said substrate shift m times a pitch of said edge, wherein m is an integer of 1 or greater.

4. A method according to claim 1, wherein an amplitude of the change of the edge of said pattern image is substantially $t/\tan\theta$, where t is a thickness of said photoresist and $\theta$ is an angle of inclination of said sloping wall relative to said substrate.

5. A method according to claim 1, wherein said wall of said opening has a first incline substantially parallel to said predetermined direction and sloping by angle $\theta y$ relative to said substrate, and a second incline substantially parallel to a direction perpendicular to said predetermined direction and sloping by an angle $\theta x$ with respect to said substrate, and wherein at least one of said pattern image and said substrate is movable in such a manner that said pattern image and said substrate shift substantially by $t/\tan\theta x$, where t is a thickness of said photoresist.

6. A method according to claim 5, wherein an amplitude of the change of the edge of said pattern is substantially $t/\tan\theta y$.

7. A method according to claim 5, wherein a pitch of the edge of said pattern image is 1/n times as large as said shift by $t/\tan\theta x$, where m is an integer of 1 or greater.

8. A method of forming a photoresist pattern having an opening with sloping walls at opposite ends, comprising:

a step of exposing a photoresist having a thickness t coated on a substrate, through a pattern image of a mask;

wherein said pattern image has two edges substantially parallel to each other; and wherein at least one of said pattern image and said substrate is moved during exposure in such a manner that in order to tilt said sloping walls by an angle $\theta$ with respect to said substrate, said pattern image and said substrate shift relatively by $t/\tan\theta$ in a direction perpendicular to said edges.

* * * * *